(12) United States Patent
Leifeste et al.

(10) Patent No.: US 11,387,126 B2
(45) Date of Patent: Jul. 12, 2022

(54) PADDLE TOOL FOR TRANSPORTING SEMICONDUCTOR WAFERS OR OTHER COMPONENTS

(71) Applicant: Raytheon Company, Waltham, MA (US)

(72) Inventors: Heather D. Leifeste, Santa Barbara, CA (US); Ron C. Stevens, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 107 days.

(21) Appl. No.: 16/673,321

(22) Filed: Nov. 4, 2019

(65) Prior Publication Data

US 2020/0350192 A1 Nov. 5, 2020

Related U.S. Application Data

(60) Provisional application No. 62/842,726, filed on May 3, 2019.

(51) Int. Cl.
*H01L 21/67* (2006.01)
*H01L 21/677* (2006.01)
*H01L 21/687* (2006.01)
*B25J 15/00* (2006.01)

(52) U.S. Cl.
CPC .... *H01L 21/67742* (2013.01); *B25J 15/0014* (2013.01); *H01L 21/68707* (2013.01)

(58) Field of Classification Search
None
See application file for complete search history.

(56) References Cited

U.S. PATENT DOCUMENTS

| 754,250 | A | * | 3/1904 | Solomon | |
|---|---|---|---|---|---|
| 910,190 | A | * | 1/1909 | Gossett | |
| 2,678,000 | A | * | 5/1954 | Scheidt | A47G 19/16 100/266 |
| 4,410,209 | A | * | 10/1983 | Trapani | B05C 13/02 294/103.1 |
| 4,417,757 | A | * | 11/1983 | Morrison | B25B 9/00 294/158 |
| 4,639,028 | A | * | 1/1987 | Olson | B65G 7/12 294/103.1 |
| 5,388,313 | A | * | 2/1995 | Cameron | A41F 3/04 24/265 EC |

(Continued)

OTHER PUBLICATIONS

Entegris, Inc., "Dippers," Jan. 1, 2013, 2 pages.

(Continued)

*Primary Examiner* — Ronald P Jarrett

(57) ABSTRACT

An apparatus includes a base configured to receive at least one component. The apparatus also includes a handle connected to the base and extending away from the base. The apparatus further includes a clip configured to slide along at least part of the handle towards and away from the base. The clip is configured to secure the at least one component to the apparatus and to release the at least one component from the apparatus. The clip is configured, after the at least one component is secured, to be locked in order to prevent release of the at least one component from the apparatus. The handle may include a lock configured to selectively prevent movement of the clip along the handle passed the lock.

20 Claims, 10 Drawing Sheets

(56) References Cited

U.S. PATENT DOCUMENTS 7,032,287 B1 * 4/2006 Spady ............... H01L 21/68707
118/500
9,538,873 B2 * 1/2017 Gardeski ................ A47G 21/10

OTHER PUBLICATIONS

Entegris, Inc., "Specialized Handling Products," Product Catalog, Microenvironments Division, 2013, 40 pages (see esp. p. 33).
H-Square Corp., "2015-2016 Product Catalog," Catalog15-16.1, 2015, 158 pages (see esp. pp. 13-19 and 70-80).
H-Square Corp.,"Antistatic Tabletop SGI Freedom Wand," Part No. FWAHAS2, 2018, 1 page.
SPS—Asia Technology Pte Ltd., "SPS-Asia Technology Product brochure," 2018, 33 pages (see esp. pp. 10-11).

* cited by examiner

PADDLE TOOL FOR TRANSPORTING SEMICONDUCTOR WAFERS OR OTHER COMPONENTS

CROSS-REFERENCE TO RELATED APPLICATION AND PRIORITY CLAIM

This application claims priority under 35 U.S.C. § 119(e) to U.S. Provisional Patent Application No. 62/842,726 filed on May 3, 2019, which is hereby incorporated by reference in its entirety.

TECHNICAL FIELD

This disclosure relates generally to handheld tools. More specifically, this disclosure relates to a paddle tool for transporting semiconductor wafers or other components.

BACKGROUND

In various situations, personnel need to move or position semiconductor wafers, other semiconductor components, or other components without actually touching the components with their hands. For example, personnel may need to move a semiconductor component or other component into and out of a liquid bath, such as a liquid bath for etching or otherwise processing the component. In those situations, the personnel typically pick up and move the components using handheld handling tools.

SUMMARY

This disclosure provides a paddle tool for transporting semiconductor wafers or other components.

In a first embodiment, an apparatus includes a base configured to receive at least one component. The apparatus also includes a handle connected to the base and extending away from the base. The apparatus further includes a clip configured to slide along at least part of the handle towards and away from the base. The clip is configured to secure the at least one component to the apparatus and to release the at least one component from the apparatus. The clip is configured, after the at least one component is secured, to be locked in order to prevent release of the at least one component from the apparatus.

In a second embodiment, a method includes placing at least one component on a base of a tool, where the tool has a handle connected to the base and extending away from the base. The method also includes sliding a clip along at least part of the handle towards the base and securing the at least one component to the tool using the clip. The method further includes locking the clip in order to prevent release of the at least one component from the tool.

In a third embodiment, a handheld tool includes a base having multiple projections located along an edge of the base. Each projection includes or defines at least one groove configured to receive a portion of at least one component. The handheld tool also includes an elongated handle connected to the base opposite the projections and extending away from the base. The handheld tool further includes a clip wrapped partially around the handle. The clip is configured to slide along at least part of the handle towards and away from the projections. The clip includes a lip or ridge configured to be selectively positioned over a portion of the at least one component in order to secure the at least one component to the handheld tool. In addition, the handheld tool includes multiple locks positioned along the handle.

Each lock is configured to selectively prevent movement of the clip away from the projections along the handle passed the lock. One of the locks is configured, after the at least one component is secured, to prevent movement of the clip away from the projections and thereby prevent release of the at least one component from the tool.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
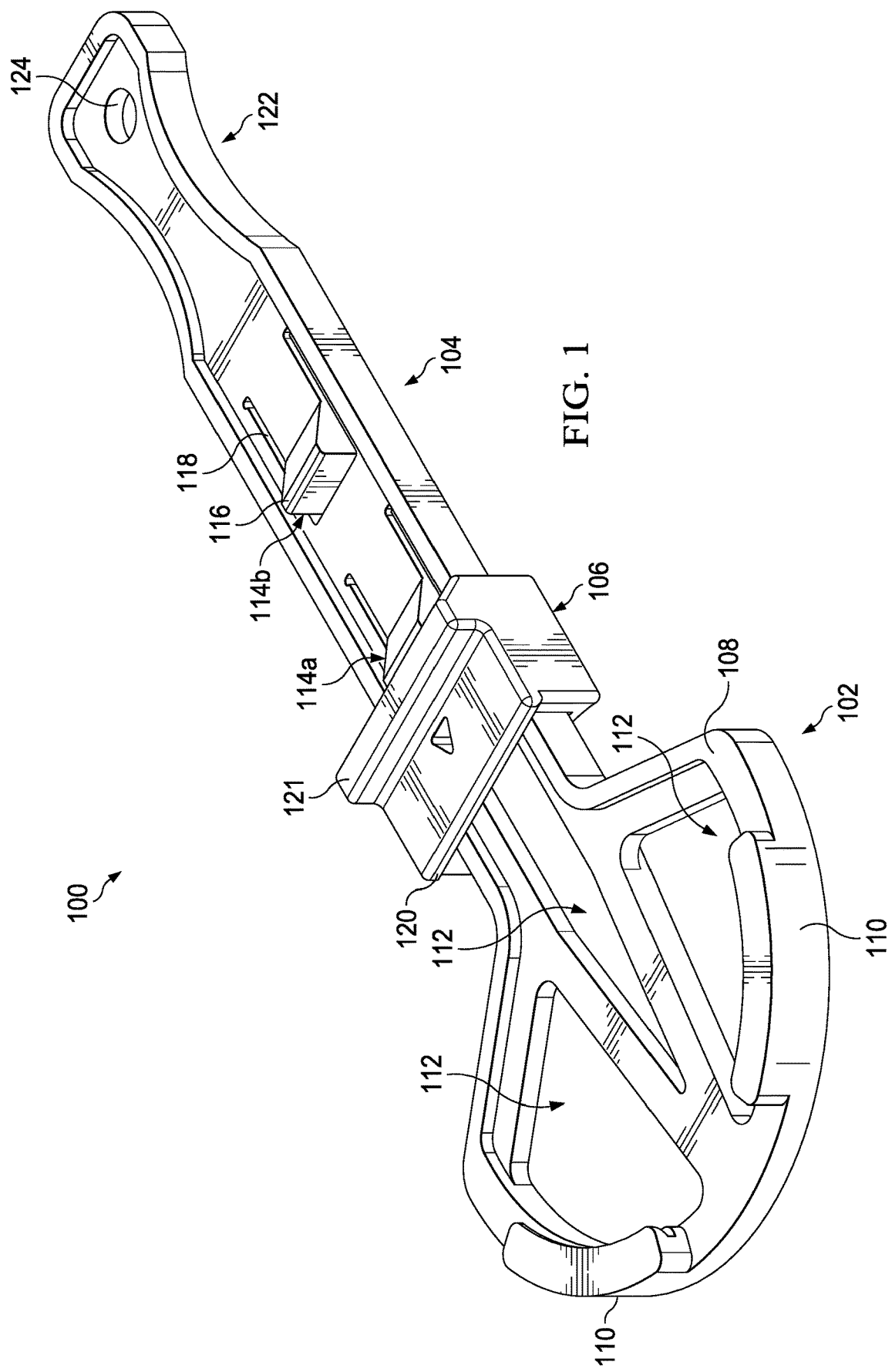
FIGS. 1 through 3 illustrate an example paddle tool for transporting semiconductor wafers or other components in accordance with this disclosure.

FIGS. 1 through 10, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, personnel can use handheld handling tools to pick up and move semiconductor wafers or other components, such as when moving semiconductor components or other components into and out of liquid baths. Unfortunately, prior handheld handling tools suffer from a number of drawbacks. For example, some handling tools merely rely on friction or gravity to hold components, so these handling tools may not secure the components in place effectively. Other handling tools use vacuum suction to hold components in place, but these handling tools cannot be used to dip the components into liquid baths. Still other handling tools have small tabs that personnel need to depress (often hard using their thumbs) in order to hold components in place. These handling tools are not ergonomic and can cause strain, and these handling tools can expose the personnel's hands to dangerous or harmful chemicals or other undesirable materials. Even if the personnel wear gloves, this may allow the chemicals or other materials to be transferred to other objects or surfaces.

This disclosure provides a handheld paddle tool for transporting semiconductor wafers or other components. As described in more detail below, the paddle tool includes a base, a handle, and a clip that is slidable along at least part of the handle. The base is configured to receive at least one semiconductor wafer, other semiconductor component, or other component. The clip is configured to slide along the handle towards the base so that the base and the clip can collectively secure the component on the paddle tool. The clip itself can also be secured in place along the handle, such as by using a lock (or one of multiple locks) positioned on the handle. This prevents undesired movement of the clip along the handle after the component is secured to the paddle tool.

In this way, the paddle tool disclosed here supports the transport of at least one component to and from a liquid bath or use in any other suitable manner. The component can be secured to the paddle tool, thereby effectively holding the component on the paddle tool without relying simply on friction or gravity. Also, at least the base of the paddle tool (and possibly other portions of the paddle tool) can be placed directly into a liquid bath, such as a liquid chemical etching bath, which cannot be done with typical vacuum suction devices. Further, the paddle tool can hold the component in place without requiring a user to continuously depress a tab or other structure, making the paddle tool more ergonomic and causing less or no strain to the user. In addition, the handle of the paddle tool can be long enough so that the base with the component can be dipped into a liquid bath or exposed to other materials while the user's hands remain relatively far away from the materials. This reduces or prevents the transfer of dangerous or harmful chemicals or other undesirable materials onto the user's hands or gloves.

Figure 2:
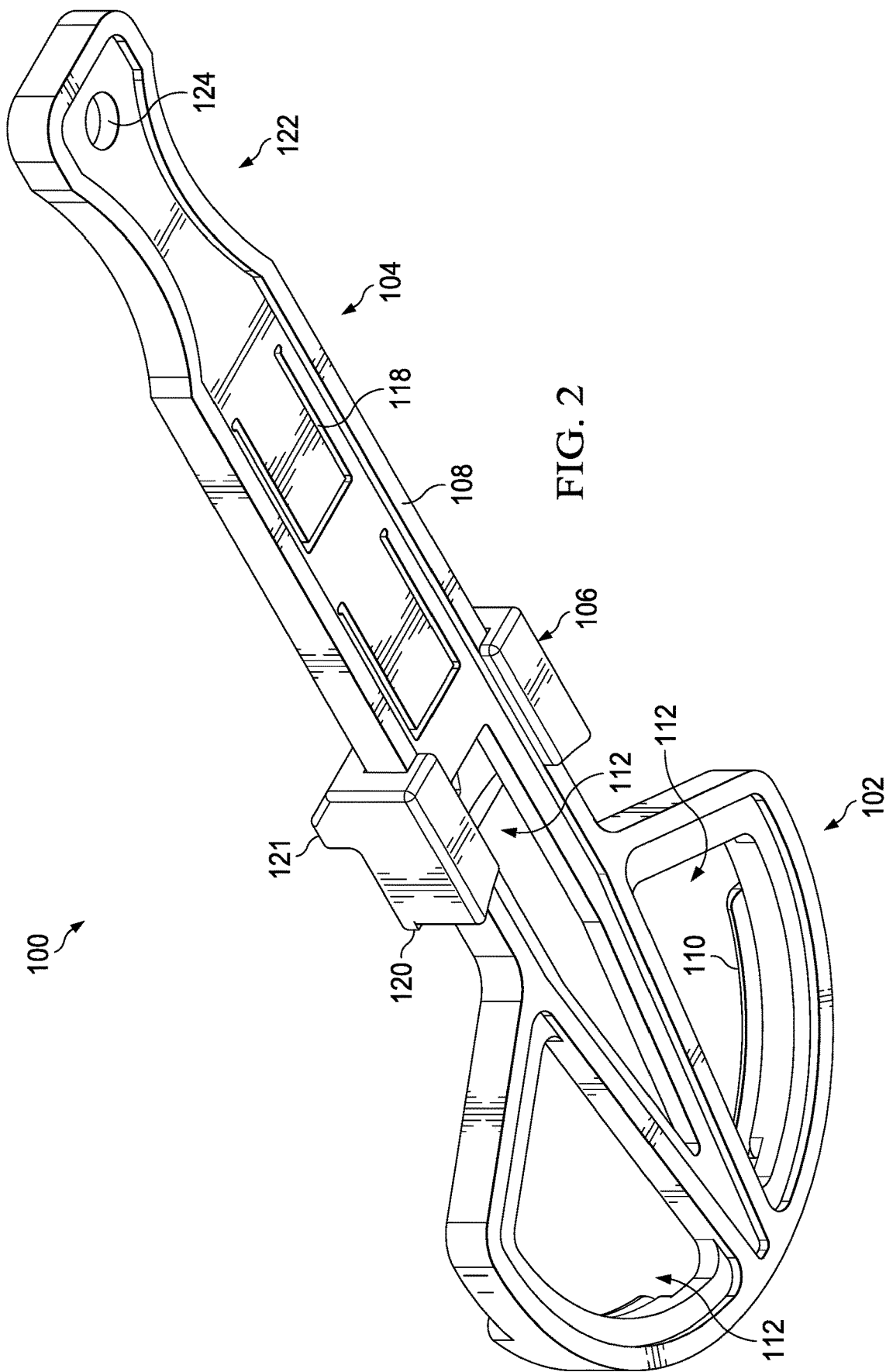
Figure 3:
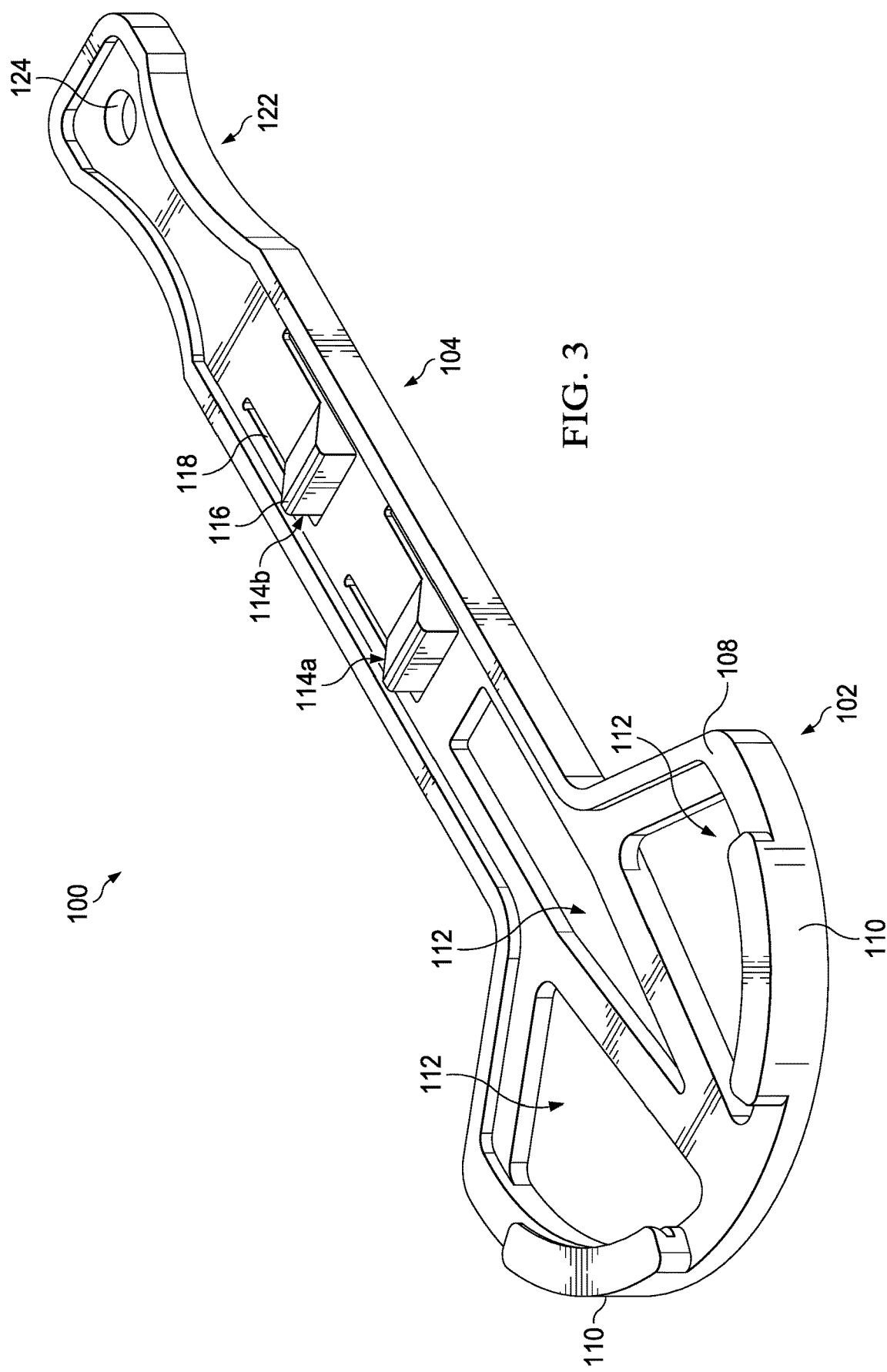

FIGS. 1 through 3 illustrate an example paddle tool 100 for transporting semiconductor wafers or other components in accordance with this disclosure. In particular, FIG. 1 illustrates a top perspective view of the paddle tool 100, FIG. 2 illustrates a bottom perspective view of the paddle tool 100, and FIG. 3 illustrates a portion of the paddle tool 100 with a movable component removed for clarity of illustration.

As shown in FIGS. 1 and 2, the paddle tool 100 generally includes a base 102, a handle 104, and a clip 106. The base 102 is configured to receive at least one semiconductor component or other component, such as one or more semiconductor wafers, metal components, or ceramic components. The base 102 is also configured to help secure the at least one component to the paddle tool 100. The base 102 may have any suitable size, shape, and dimensions, which may depend (at least in part) on the components to be transported using the paddle tool 100. In this example, the base 102 has a rounded or curved outer edge along much of the base 102 and two relatively straight edges leading to the handle 104. However, the design of the base 102 may vary as needed or desired.

The handle 104 is connected to the base 102 and extends away from the base 102. The handle 104 can be grasped or held by a user and manipulated by the user as needed or desired, such as to move the paddle tool 100 and any component or components secured to the paddle tool 100. The paddle tool 100 can be manipulated by the user to support any desired functions. For instance, the handle 104 may be used to dip the base 102 and at least component into a liquid bath, to move the base 102 and the at least component back and forth within the liquid bath, and to remove the base 102 and the at least component from the liquid bath. The handle 104 can be used to carry or transport the at least one component for any other suitable purpose. The handle 104 may have any suitable size, shape, and dimensions, which may depend (at least in part) on the desired separation of the user's hands from the base 102 in order to protect against contact of the user's hands with a liquid bath or other materials interacting with the at least one component. In this example, the handle 104 is elongated and has generally straight longer sides. However, the design of the handle 104 may vary as needed or desired.

The clip 106 is configured to slide or move along at least part of the handle 104. The base 102 and the clip 106 are collectively configured to secure at least one component to the paddle tool 100. For example, a user may slide the clip 106 along the handle 104 towards the base 102 in order to narrow a space between the clip 106 and the base 102, thereby capturing and securing the at least one component to the paddle tool 100. The user may also slide the clip 106 along the handle 104 away from the base 102 in order to enlarge the space between the clip 106 and the base 102, thereby releasing the at least one component from the paddle tool 100. The user can slide the clip 106 back and forth along at least part of the handle 104 as needed to change a spacing between the clip 106 and the base 102. This may allow different components to be secured to and released from the paddle tool 100 as needed based on the movement of the clip 106 along the handle 104. In some embodiments, the paddle tool 100 can be designed for use with components having a particular size, such as semiconductor wafers or other components having a specific diameter and thickness. In other embodiments, the paddle tool 100 can be used with components of different sizes, such as semiconductor wafers or other components of different diameters, based on proper positioning of the clip 106 along the handle 104. The clip 106 may have any suitable size, shape, and dimensions. In this example, the clip 106 is generally rectangular and wraps around the handle 104. However, the design of the clip 106 may vary as needed or desired.

As shown in FIGS. 1 through 3, the top major surface and the bottom major surface of the paddle tool 100 are recessed. That is, outer edges 108 of the paddle tool 100 extending along and around the base 102 and the handle 104 are elevated compared to interior portions of the base 102 and the handle 104. The raised edges 108 of the base 102 can provide a substantially flat surface on which at least one component rests, while the raised edges 108 of the handle 104 can help to facilitate grasping or manipulation of the handle 104. However, the recessing of the major surfaces of the paddle tool 100 is not required, and the use of raised edges 108 along the outer periphery of the paddle tool 100 may be omitted if desired.

As shown here, one or more projections 110 extend upward from the base 102 and help to hold at least one component on the tool 100. For example, as described in more detail below, each of the projections 110 may include one or more grooves, which can receive peripheral portions or other portions of the at least one component being secured to the paddle tool 100. The height of each projection 110 can vary based on various factors, such as the expected size of at least one component to be secured. In some embodiments, for instance, the paddle tool 100 can be used to secure a semiconductor wafer, such as one having a height of about one millimeter. The projection(s) 110 may have an equal or greater height than the semiconductor wafer or other component(s). Note that while two relatively long symmetric projections 110 extending generally along the lower portion of the base 102 are shown here, the tool 100 may include any suitable number of projections 110 (including a single projection 110) in any suitable position(s) or arrangement(s).

The base 102 and optionally at least part of the handle 104 may include one or more openings 112, which represent open areas of the tool 100. The one or more openings 112 may, for example, allow liquid in a liquid bath (such as a chemical etching bath) to easily pass through the paddle tool 100 and contact the at least one component secured to the paddle tool 100. The one or more openings 112 may also allow liquid from the liquid bath to drain off and away from the at least one component secured to the paddle tool 100 after the at least one component is removed from the liquid bath. Note that the number of openings 112, the shapes of the openings 112, and the positions of the openings 112 shown here are examples only. The tool 100 may include any suitable number of openings 112 having any suitable size(s) and shape(s) in any suitable arrangement. Also, there may be times when no openings 112 are needed in the paddle tool 100, in which case the openings 112 may be omitted.

The handle 104 includes one or more locks 114a-114b, which can be seen partially in FIG. 1 and more clearly in FIG. 3 (where the clip 106 has been removed for clarity). The one or more locks 114a-114b can be used to prevent undesired movement of the clip 106 upward or downward along the handle 104. In this example, the handle 104 includes two locks 114a-114b, although the tool 100 may include any suitable number of locks 114a-114b (including a single lock 114a or 114b) in any suitable location(s) along the handle 104.

As shown in FIGS. 1 through 3, each lock 114a-114b is formed using a raised projection 116 and slits 118 in the handle 104. In this particular example, each of the raised projections 116 has a generally triangular cross-sectional shape extending along the longer dimension of the handle 104. The angled surface on top of each raised projection 116 permits the clip 106 to easily slide over each lock 114a-114b when the clip 106 is moving towards the base 102 of the paddle tool 100. However, the side surface of each raised projection 116 that is generally perpendicular to the surrounding portion of the handle 104 helps to block the clip 106 from sliding over each lock 114a-114b when the clip 106 is moving away from the base 102 of the paddle tool 100. The slits 118 of each lock 114a-114b allow the raised projection 116 of that lock 114a-114b to be pushed downward so that the clip 106 can pass over the raised projection 116. In this way, each lock 114a-114b can be used to help secure the clip 106 in a desired location (or at least prevent movement of the clip 106 past a certain location), but each lock 114a-114b can be easily overcome by a user of the paddle tool 100 pushing down on that lock 114a-114b. Note, however, that each lock 114a-114b may have any other suitable form that blocks movement of the clip 106 while allowing a user to selectively permit movement of the clip 106.

In this example, a bottom end of the clip 106 can contact or be positioned extremely close to at least one component being secured to the paddle tool 100, and a lip or ridge 120 of the clip 106 can extend over part of the outer periphery or other portion of the at least one component. Along with the groove(s) of the projection(s) 110 at the opposite end of the base 102, this allows the clip 106 to be used to help secure the at least one component to the paddle tool 100. In this particular example, the lip or ridge 120 of the clip 106 is generally straight and extends across all or substantially all of the bottom edge of the clip 106. However, the lip or ridge 120 may have any other suitable form, such as when a discontinuous lip or ridge 120 is used or when a lip or ridge 120 having a curved or non-uniform shape across the clip 106 is used.

To facilitate back and forth movement, a raised portion 121 of the clip 106 is positioned along the front major surface of the clip 106. Among other things, the raised portion 121 of the clip 106 can increase the surface area of the clip 106 that is contacted by a user's thumb or other finger, which can make sliding the clip 106 back and forth easier for the user. In this particular example, the raised portion 121 is location along the top edge of the clip 106, although the raised portion 121 may be positioned elsewhere on the clip 106. Also, in other embodiments, the raised portion 121 may be omitted, and other mechanisms (such as a concave front surface of the clip 106) may optionally be used to facilitate movement of the clip 106.

In some embodiments, the lock 114a can be used to hold the clip 106 at or near the edge of at least one component in order to reduce the likelihood of or to prevent the inadvertent release of the at least one component from the paddle tool 100. In this way, the clip 106 can be locked in place to securely hold the component(s) on the paddle tool 100. The clip 106 can hold the component(s) securely until the user of the paddle tool 100 depresses the lock 114a to move the clip 106 upward along the handle 104. The other lock 114b can be used to prevent the clip 106 from sliding completely off the handle 104 until depressed, or the lock 114b can be used to selectively block further upward movement of the clip 106 in order to secure one or more larger components to the paddle tool 100. Note, however, that the lock 114b can be depressed to allow the clip 106 to be completed removed from the handle 104. This may be necessary or desirable for various reasons, such as to clean the paddle tool 100 and/or the clip 106 or to replace the clip 106.

The handle 104 in this example includes recesses 122 along its sides and a mounting hole 124 near the top of the handle 104. The recesses 122 may facilitate easier grasping of the tool 100, and the mounting hole 124 allows hanging of the tool 100 from a workbench or other structure. Note, however, that the handle 104 may have any other suitable form factor and features, and the recesses 122 and/or the mounting hole 124 may be omitted if desired.

Based on this design, once at least one component is secured using the base 102 and the clip 106, the user of the paddle tool 100 may only need to hold the handle 104 of the paddle tool 100. The user is not required to constantly press down on a tab or other structure to hold the component(s) in place on the tool 100. The tool 100 allows the clip 106 to be locked in place without friction or operator input, which helps to significantly reduce or eliminate ergonomic strain. The component(s) can be secured by the tool 100 since the clip 106 is held in place and cannot move (at least to any significant extent) until the user depresses a lock 114a or 114b to release the clip 106. However, the clip 106 can be easily disengaged by pressing the lock 114a or 114b, which allows the component(s) to easily slide off the paddle tool 100 into a liquid bath or to otherwise be removed from the tool 100. Further, the handle 104 is relatively long, at least in the sense that the handle 104 extends a relatively large distance away from the at least one component being held by the paddle tool 100. In addition, when the handle 104 is generally rigid, the component(s) can be more easily moved back and forth (possibly vigorously) while in a liquid bath with less user strain, and the user's hands are kept away from the liquid bath due to the length of the handle 104. The paddle tool 100 therefore helps to reduce or prevent chemicals or other undesirable materials from getting on the user's hands or gloves. Finally, the paddle tool 100 can be used to secure soft or fragile components, such as soft or fragile semiconductor substrates or wafers, without putting excessive stresses on the edges of the components.

The paddle tool 100 can be formed from any suitable material or materials. If the paddle tool 100 is to be at least partially placed in a chemical bath, the material or materials forming the paddle tool 100 can be based on the chemical or chemicals used in the chemical bath. In some embodiments, the paddle tool 100 can be formed from high-purity perfluoroalkoxy alkanes (PFA), polytetrafluoroethylene (PTFE), or other polymers or suitable materials. The paddle tool 100 can also be formed in any suitable manner, such as injection molding, additive manufacturing, or other suitable techniques. In some embodiments, the base 102 and the handle 104 of the tool 100 can be formed as an integral structure, and the clip 106 can be formed separately and attached to the handle 104 by sliding the clip 106 onto the handle 104. Note, however, that the base 102 and the handle 104 of the tool 100 may also be formed separately and coupled to one another in any suitable manner.

The design of the paddle tool 100 can also be easily modified as needed or desired. For example, the size and shape of the base 102 can be easily altered to accommodate components of different sizes and shapes. As another example, depending on the stiffness of the material(s) used to fabricate the paddle tool 100, the thicknesses of different portions of the tool 100 and the sizes, shapes, and positions of the openings 112 can vary to provide the desired level of stiffness or flexibility for the overall tool 100. As yet another example, while a mounting hole 124 is shown as being used to hang the tool 100, the tool 100 may include a hooked portion at the top of the handle 104 or other structure or mechanism allowing the tool 100 to be placed in a desired location.

Figure 4:
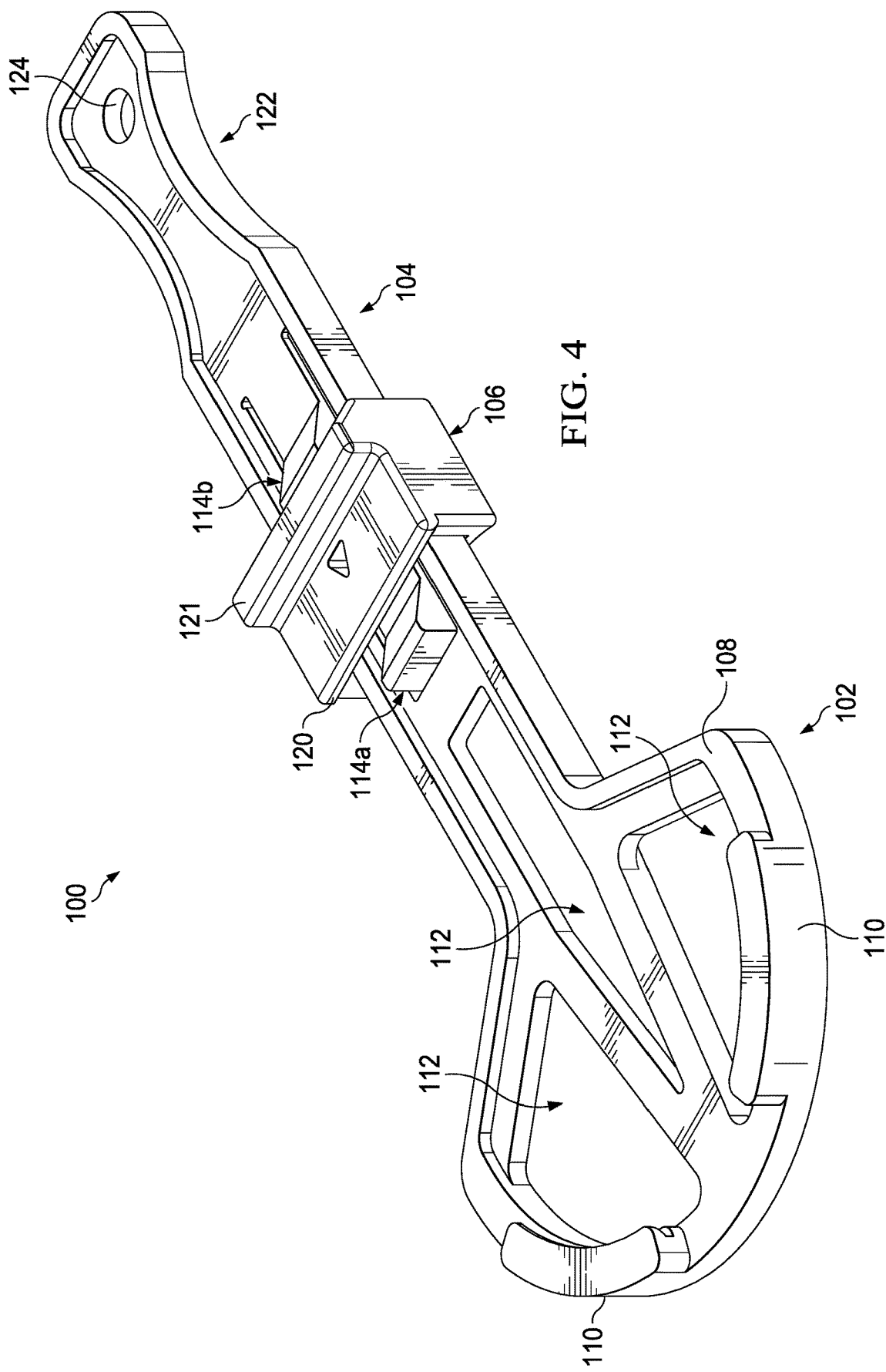
FIG. 4 illustrates an example movement of a clip along a handle of a paddle tool for transporting semiconductor wafers or other components in accordance with this disclosure.

FIG. 4 illustrates an example movement of the clip 106 along the handle 104 of the paddle tool 100 for transporting semiconductor wafers or other components in accordance with this disclosure. Unlike FIGS. 1 through 3 which show that the clip 106 is being held in a lower position by the lock 114a, the clip 106 in FIG. 4 has been moved above the lock 114a. This can be accomplished due to depression of the raised projection 116 of the lock 114a by the user and sliding of the clip 106 upward along the handle 104.

In FIG. 4, the lock 114b prevents further upward movement of the clip 106, which helps to prevent complete removal of the clip 106 from the handle 104. However, the raised projection 116 of the lock 114b can also be depressed to allow for complete removal of the clip 106 from the handle 104, such as for cleaning or replacement. In some cases, the clip 106 can be moved above the lock 114a to the lock 114b in order to release any previously-secured smaller components that were being held by the paddle tool 100. As a result, the clip 106 can be maintained between the locks 114a-114b to help hold the clip 106 on the handle 104, such as when the paddle tool 100 is not in use. In other cases, the lock 114b can be used to maintain the clip 106 in a position to secure one or more larger components to the paddle tool 100. Note, however, that the paddle tool 100 need not be configured or used to secure components of different sizes.

Although FIGS. 1 through 4 illustrate one example of a paddle tool 100 for transporting semiconductor wafers or other components and different states of the paddle tool 100, various changes may be made to FIGS. 1 through 4. For example, the relative sizes, shapes, and dimensions of the various components of the paddle tool 100 and of the paddle tool 100 itself can vary as needed or desired. Also, the clip 106 and locks 114a-114b can have any other suitable design supporting a "hands-free" secure locking mechanism, meaning the user can lock the tool 100 onto one or more components and the user does not have to continuously use his or her hand to secure the component(s) to the tool 100. The user is therefore free to transport the component(s), subject the component(s) to vigorous back-and-forth movements, or otherwise move the component(s) using the paddle tool 100, and the component(s) will remain secured by or on the tool 100. Other example types of "hands-free" locking mechanisms that may be used can include one or more spring-loaded clips, sliding clips, or any other suitable clips that can be positioned by a user and then released. In addition, if more than two locks are positioned along the handle 104, the paddle tool 100 may be used to secure components of different sizes.

Figure 5:
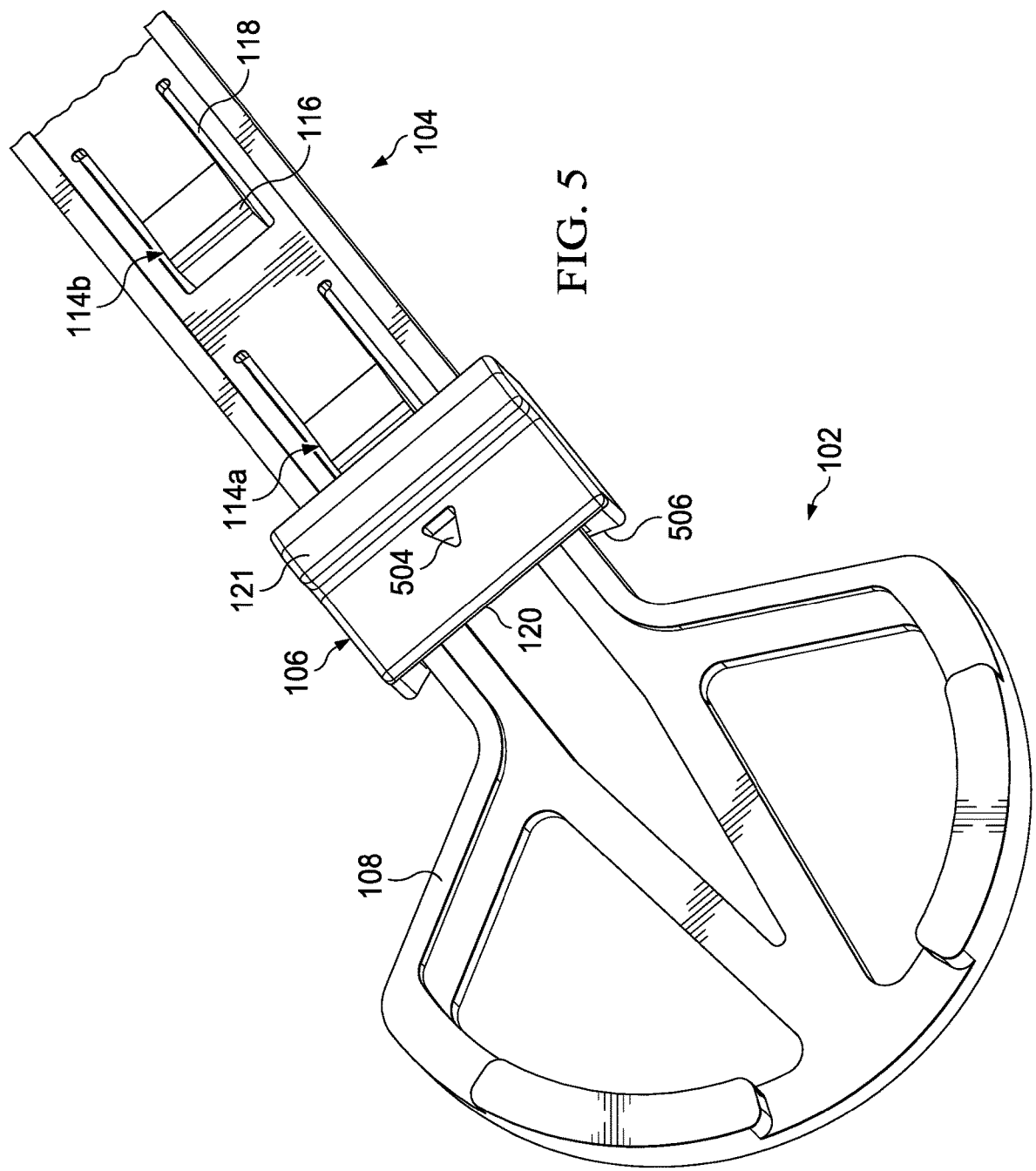
FIGS. 5 through 9 illustrate example enlarged views of portions of a paddle tool for transporting semiconductor wafers or other components in accordance with this disclosure.
Figures 6, 7:
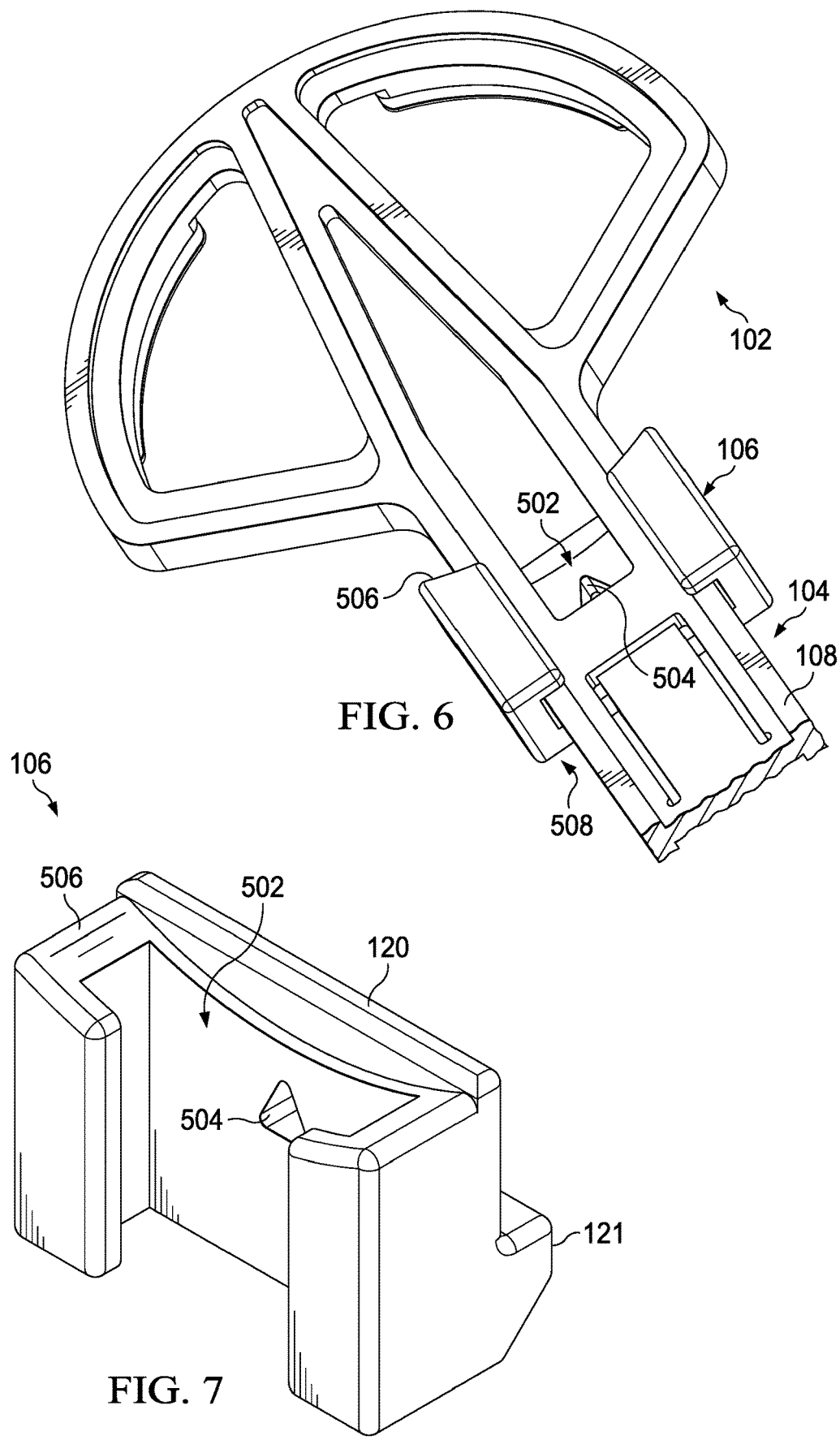
Figure 8:
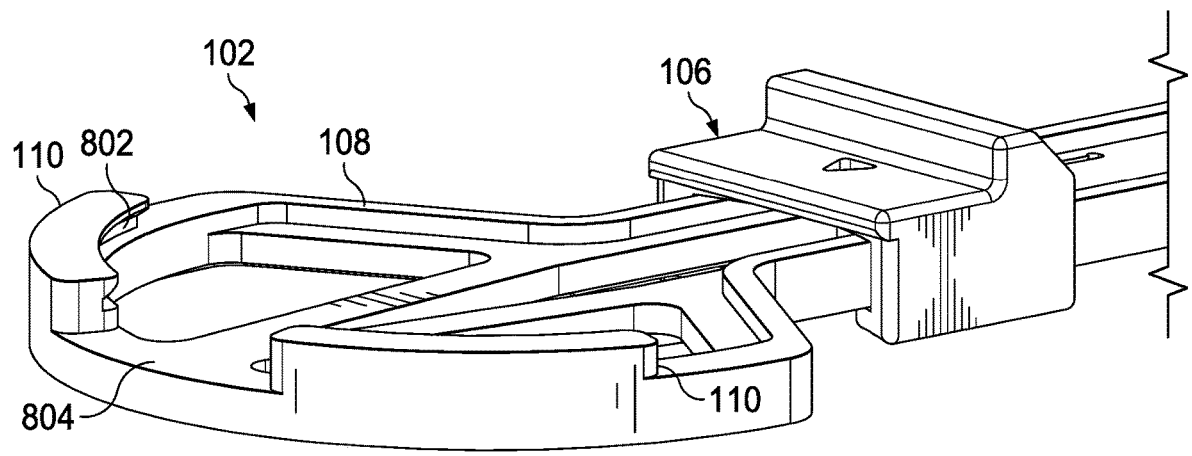
Figure 9:
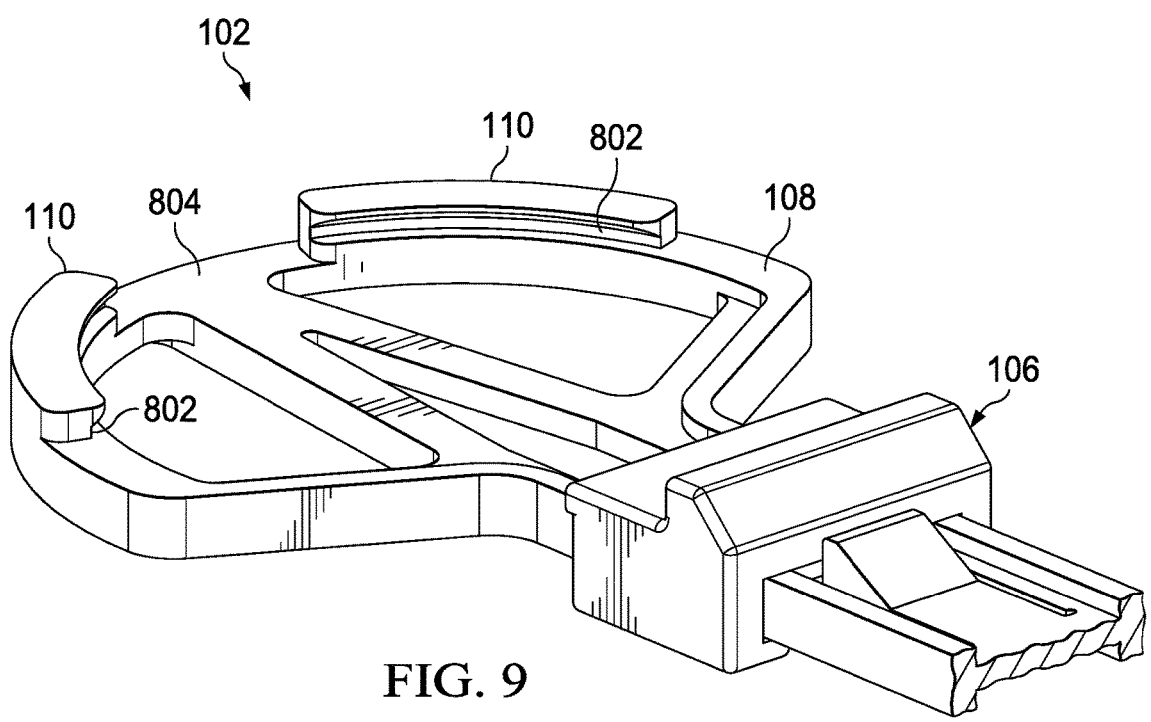

FIGS. 5 through 9 illustrate example enlarged views of portions of the paddle tool 100 for transporting semiconductor wafers or other components in accordance with this disclosure. In particular, FIG. 5 illustrates a top perspective view of a central portion of the paddle tool 100, FIG. 6 illustrates a bottom perspective view of a lower portion of the paddle tool 100, FIG. 7 illustrates a bottom view of the clip 106 in isolation, and FIGS. 8 and 9 illustrate different top perspective views of the base 102.

As shown in FIGS. 5 and 6, at least part of the base 102, part of the handle 104, and the clip 106 are shown, and the clip 106 wraps around the sides of the handle 104. In this particular example, the clip 106 extends continuously across the top of the handle 104 and continuously down the sides of the handle 104, but the clip 106 only wraps around the raised edges 108 on the bottom of the handle 104. A gap 502 in the clip 106 along the bottom of the handle 104 provides a space to accommodate a depressed lock 114a or 114b, allowing the clip 106 to slide along the handle 104 past the depressed lock 114a or 114b. Note, however, that the use of the gap 502 in the clip 106 is not required, and the clip 106 can have any other suitable design. For instance, the clip 106 may extend completely around the handle 104, such as when the clip 106 is thick enough and has a large enough internal cavity to accommodate a depressed lock 114a or 114b.

A marking 504 on the clip 106 can be used to help identify a proper orientation of the clip 106 on the handle 104. In this example, the marking 504 represents a triangular-shaped opening through the clip 106, although other markings may be used. A specific orientation of the clip 106 is used here since the clip 106 also includes angled surfaces 506 along one end of the clip 106. These surfaces 506 are angled so that the surfaces 506 slant inward and can match or be similar to the angle that the base 102 extends from each side of the handle 104. The surfaces 506 may actually contact the base 102 at the extreme end of travel of the clip 106. Surfaces 508 on the opposite end of the clip 106 may or may not be angled. In some embodiments, the surfaces 508 may align with the side surfaces of the locks 114a-114b, which can help to prevent movement of the clip 106. If not, the marking 504 can be used to help ensure that the slanted surfaces 506 are facing the base 102 and the surfaces 508 are not. However, the clip 106 may have any other suitable designs, which may or may not require a specific orientation of the clip 106.

As shown in FIG. 7, the clip 106 is shown separate from the remainder of the paddle tool 100. As can be seen in FIG. 7, the lip or ridge 120 extends over the angled surfaces 506 of the clip 106. In this example, the angled surfaces 506 collectively form a single curved surface that is curved across the entire width of the clip 106. As a result, the lip or ridge 120 is wider in a middle area of the clip 106 and smaller along the sides of the clip 106. This shape may be useful, for instance, when the clip 106 is being used to secure a circular object, such as a round semiconductor wafer. However, other designs for the lip or ridge 120 and the angled surfaces 506 may be used as needed or desired.

As shown in FIGS. 8 and 9, in different top perspective views of the base 102, it can be seen that each projection 110 includes or helps define at least one groove 802. In this example, each groove 802 can have an upper extent that is defined by an upper portion of a projection 110 overhanging an empty space. Also, each groove 802 can have a lower extent that is defined by an upper surface of the raised edge 108. However, a groove 802 can be formed in any other suitable manner in or using the projection 110. In this example, there is also a gap 804 in the raised edge 108 of the base 102. The gap 804 may be used to allow liquid from a liquid bath to drain from behind one or more components secured to the paddle tool 100 or for any other suitable purpose. Note, however, that the gap 804 may be omitted, and the raised edge 108 may continue around the entire tip of the base 102.

Although FIGS. 5 through 9 illustrate example enlarged views of portions of the paddle tool 100 for transporting semiconductor wafers or other components, various changes may be made to FIGS. 5 through 9. For example, the relative sizes, shapes, and dimensions of the various components of the paddle tool 100 can vary as needed or desired. Also, the clip 106 and locks 114a-114b can have any other suitable design supporting a hands-free secure locking mechanism.

Figure 10:
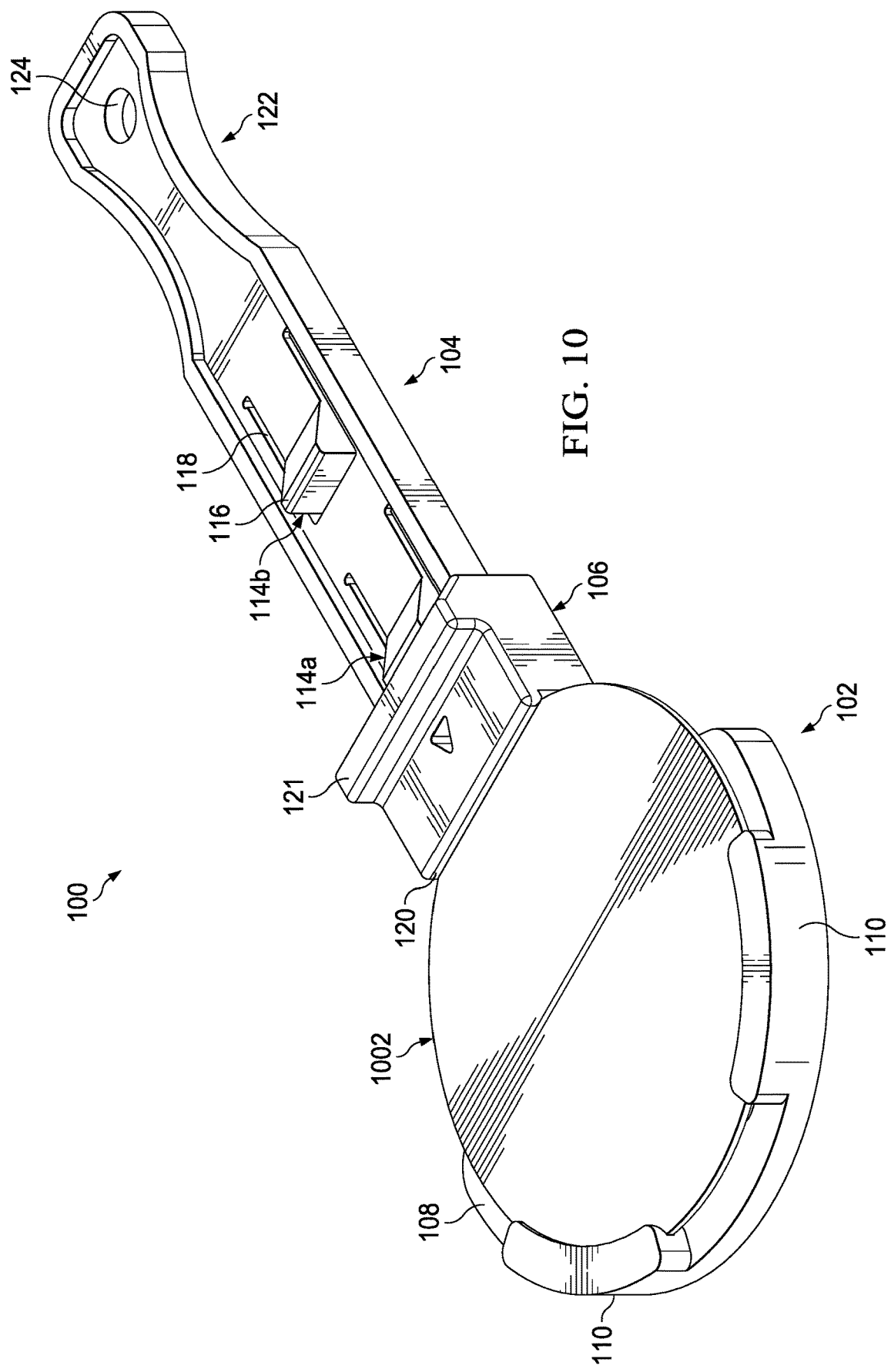
FIG. 10 illustrates an example use of a paddle tool for transporting semiconductor wafers or other components in accordance with this disclosure.

FIG. 10 illustrates an example use of the paddle tool 100 for transporting semiconductor wafers or other components in accordance with this disclosure. As shown in FIG. 10, a semiconductor wafer 1002 has been secured to the paddle tool 100. Peripheral portions along the lower edge of the semiconductor wafer 1002 have been placed within the grooves 802 defined in or by the projections 110 of the base 102. A peripheral portion along the upper edge of the semiconductor wafer 1002 has been covered by the lip or ridge 120 of the clip 106 and may also be physically contacted by other portions of the clip 106. This prevents the semiconductor wafer 1002 from moving, at least to the extent necessary to become unsecured from the paddle tool 100.

As can be seen here, the lock 114a helps to hold the clip 106 in place, thereby preventing movement of the clip 106 away from the semiconductor wafer 1002 (which otherwise would release the semiconductor wafer 1002 from the paddle tool 100). As a result, the semiconductor wafer 1002 remains secured to the paddle tool 100 without requiring a user to constantly apply pressure or force against the clip 106. This leaves the user's hands free to grasp the handle 104, move the handle and therefore the paddle tool 100 and the semiconductor wafer 1002 back and forth in a liquid bath, or perform other functions using the paddle tool 100.

Although FIG. 10 illustrates one example use of the paddle tool 100 for transporting semiconductor wafers or other components, various changes may be made to FIG. 10. For example, other components besides semiconductor wafers may be transported using the paddle tool 100. Also, the size and shape of the paddle tool 100 can be easily modified to support its use with semiconductor wafers or other components of other sizes and shapes.

Figure 11:
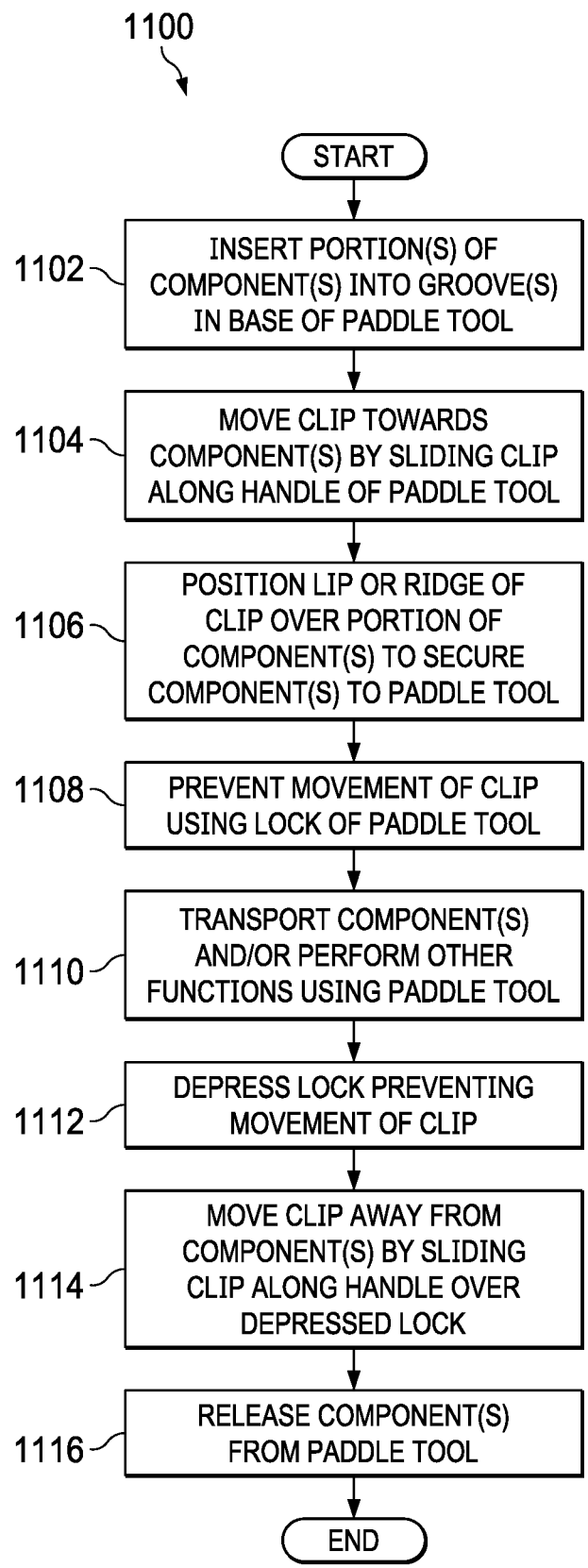
FIG. 11 illustrates an example method for transporting semiconductor wafers or other components using a paddle tool in accordance with this disclosure.

FIG. 11 illustrates an example method 1100 for transporting semiconductor wafers or other components using a paddle tool in accordance with this disclosure. For ease of explanation, the method 1100 is described as involving the use of the paddle tool 100 with the semiconductor wafer 1002. However, the method 1100 may involve the use of any suitable paddle tool designed in accordance with this disclosure, and the method 1100 may involve the use of any suitable component or components.

As shown in FIG. 11, one or more portions of at least one component are inserted into one or more grooves in a base of a paddle tool at step 1102. This may include, for example, a user manipulating the paddle tool 100 and/or the semiconductor wafer 1002 to insert one or more portions along the periphery of the semiconductor wafer 1002 into one or more grooves 802 in the base 102 of the paddle tool 100. A clip of the paddle tool is moved towards the at least one component by sliding the clip along the handle of the paddle tool at step 1104. This may include, for example, the user pushing the clip 106 along the handle 104 of the paddle tool 100 towards the base 102 of the paddle tool 100. During this movement of the clip 106, the clip 106 can pass over at least one lock 114a-114b on the handle 104. In some cases, each lock 114a-114b may have a triangular or other suitably-shaped raised projection 116 that enables the clip 106 to slide over that lock 114a-114b without requiring the user to depress that lock 114a-114b with his or her finger.

Eventually, the clip is moved so that a lip or ridge of the clip is positioned over a portion of the at least one component, thereby securing the at least one component to the paddle tool at step 1106. Also, movement of the clip is prevented using a lock of the paddle tool at step 1108. This may include, for example, the user pushing the clip 106 until the clip 106 contacts the semiconductor wafer 1002. This may also include the clip 106 passing over the lock 114a and then the lock 114a returning to a position that prevents the clip 106 from moving away from the base 102.

At this point, the at least one component is secured to the paddle tool, and the paddle tool is used to transport the at least one component and/or to perform one or more other functions involving the at least one component at step 1110. This may include, for example, the user using the handle 104 of the paddle tool 100 to move the semiconductor wafer 1002, insert the semiconductor wafer 1002 into a liquid bath, move the semiconductor wafer 1002 back and forth in the liquid bath, remove the semiconductor wafer 1002 from the liquid bath, and transport the semiconductor wafer 1002 back to an original location or to another location. Note that the semiconductor wafer 1002 or other component may be removed from the paddle tool 100 during processing, such as to allow the semiconductor wafer 1002 to sit in the liquid bath or to undergo other processing operations in which the paddle tool 100 cannot or should not be present. Also note that there are a wide variety of operations that may occur here, and this disclosure does not limit the use of the paddle tool 100 to components being inserted into liquid baths.

Eventually, the transport or other operation(s) involving the at least one component can be completed. To remove the at least one component from the paddle tool, the lock preventing movement of the clip is depressed at step 1112. This may include, for example, the user depressing the raised projection 116 of the lock 114a, thereby moving the lock 114a downward and under the clip 106. The clip is moved away from the at least one component by sliding the clip along the handle and over the depressed lock at step 1114. This may include, for example, the user sliding the clip 106 upward along the handle 104 over the lock 114a. This releases the at least one component at step 1116.

Although FIG. 11 illustrates one example of a method 1100 for transporting semiconductor wafers or other components using a paddle tool, various changes may be made to FIG. 11. For example, while shown as a series of steps, various steps in FIG. 11 may overlap, occur in parallel, occur in a different order, or occur any number of times.

Figure 12:
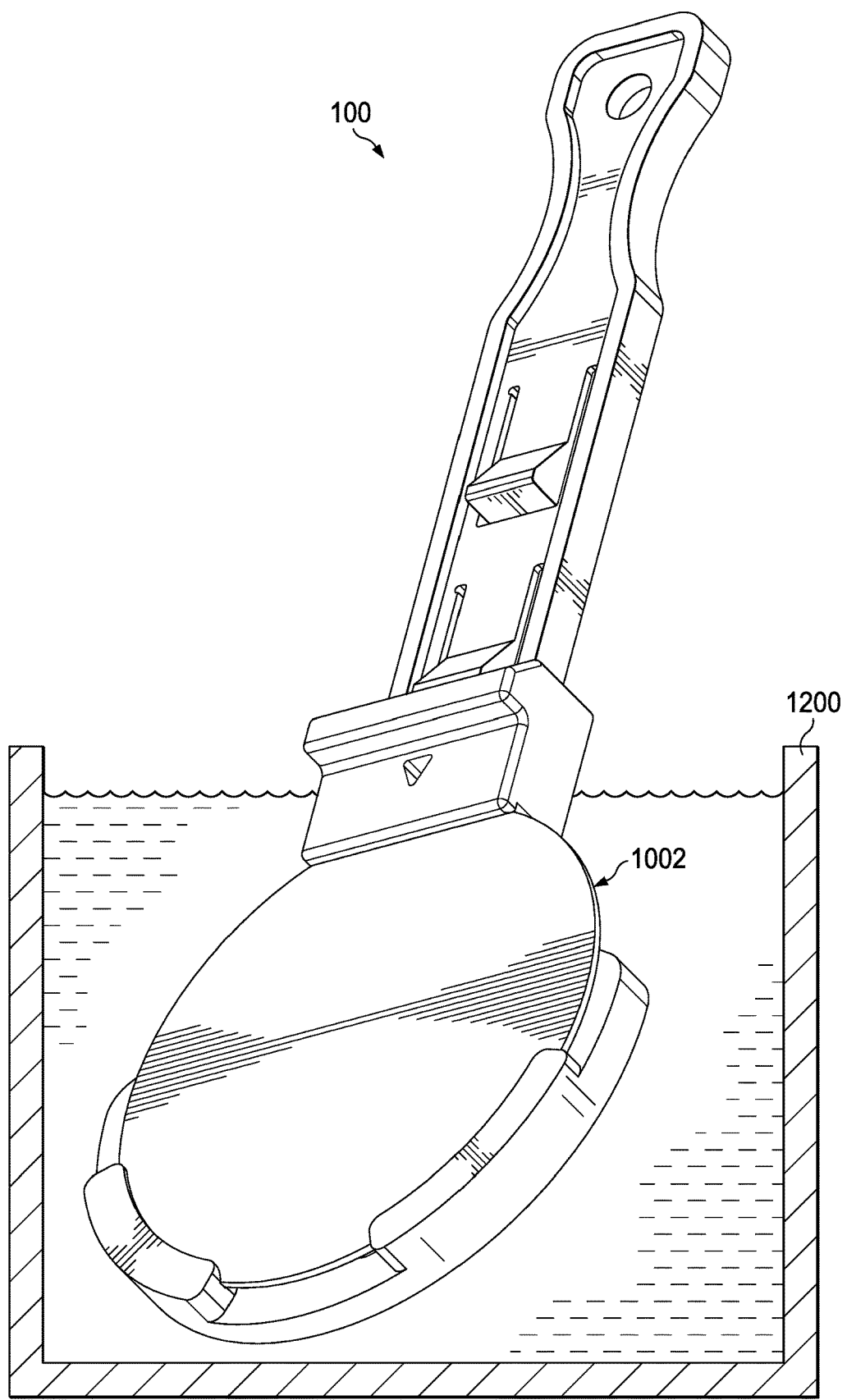
FIG. 12 illustrates an example use of a paddle tool for placing at least one semiconductor wafer or other components into a liquid bath in accordance with this disclosure.

FIG. 12 illustrates an example use of a paddle tool 100 for placing at least one semiconductor wafer 1002 or other components into a liquid bath 1200 in accordance with this disclosure.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Note that while various directional terms (such as top, bottom, upper, and lower) have been used in the description above, these directional terms are merely made with reference to the specific orientation of the paddle tool 100 as shown in various figures. These terms are used as a matter of convenience and do not impart any specific orientation of the paddle tool 100 during use.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a base including a planar surface configured to receive at least one component;
   a handle connected to the base and extending away from the base; and
   a clip including a lip or ridge, the clip configured to:
      slide along at least part of the handle towards the base to move the lip or ridge over a portion of the at least one component in contact with the planar surface in order to secure the at least one component to the planar surface; and
      slide along the at least part of the handle away from the base to move the lip or ridge away from the portion of the at least one component in order to release the at least one component from the planar surface;
   wherein the clip is further configured, after the at least one component is secured, to be locked in order to prevent release of the at least one component from the planar surface.

2. The apparatus of claim 1, wherein the handle comprises a lock configured to selectively prevent movement of the clip along the handle past the lock.

3. The apparatus of claim 2, wherein the handle comprises multiple locks at different locations along the handle.

4. The apparatus of claim 1, further comprising one or more projections extending from the base, the clip configured to be moved towards and away from the one or more projections.

5. The apparatus of claim 4, wherein each projection comprises or defines at least one groove configured to receive a portion of the at least one component.

6. The apparatus of claim 1, wherein the base comprises one or more openings.

7. A method comprising:
   placing at least one component on a planar surface of a base of a tool, the tool having a handle connected to the base and extending away from the base;
   sliding a clip along at least part of the handle towards the base to move a lip or ridge of the clip over a portion of the at least one component in contact with the planar surface in order to secure the at least one component to the planar surface; and
   locking the clip in order to prevent release of the at least one component from the planar surface.

8. The method of claim 7, further comprising:
   sliding the clip along the at least part of the handle away from the base to move the lip or ridge away from the portion of the at least one component in order to release the at least one component from the planar surface.

9. The method of claim 7, wherein locking the clip comprises using a lock on the handle to selectively prevent movement of the clip along the handle past the lock.

10. The method of claim 9, wherein the handle comprises multiple locks at different locations along the handle.

11. The method of claim 7, wherein securing the at least one component to the planar surface comprises securing the at least one component to the planar surface between the clip and one or more projections extending from the base, the clip configured to be moved towards and away from the one or more projections.

12. The method of claim 11, wherein each projection comprises or defines at least one groove configured to receive a portion of the at least one component.

13. The method of claim 7, further comprising:
   placing the at least one component in a liquid bath using the tool.

14. A handheld tool comprising:
   a base comprising:
      a planar surface configured to receive at least one component; and
      multiple projections located along an edge of the base, each projection comprising or defining at least one groove configured to receive a first portion of the at least one component;
   an elongated handle connected to the base opposite the projections and extending away from the base;
   a clip wrapped partially around the handle, the clip configured to slide along at least part of the handle towards and away from the projections, the clip comprising a lip or ridge configured to be selectively positioned over a second portion of the at least one component in contact with the planar surface in order to secure the at least one component to the planar surface; and multiple locks positioned along the handle, each lock configured to selectively prevent movement of the clip away from the projections along the handle past the lock;

wherein one of the locks is configured, after the at least one component is secured, to prevent movement of the clip away from the projections and thereby prevent release of the at least one component from the planar surface.

15. The handheld tool of claim 14, wherein each lock comprises a raised projection having:
    an angled top surface configured to permit movement of the clip towards the projections; and
    a side surface configured to block movement of the clip away from the projections.

16. The handheld tool of claim 15, wherein each lock further comprises slits along multiple sides of the raised projection, the slits configured to permit the raised projection to be depressed so that the side surface no longer blocks movement of the clip away from the projections.

17. The handheld tool of claim 14, wherein the base comprises multiple openings extending through the planar surface of the base.

18. A handheld tool comprising:
    a base comprising multiple projections located along an edge of the base, each projection comprising or defining at least one groove configured to receive a first portion of at least one component;
    an elongated handle connected to the base opposite the projections and extending away from the base;
    a clip wrapped partially around the handle, the clip configured to slide along at least part of the handle towards and away from the projections, the clip comprising a lip or ridge configured to be selectively positioned over a second portion of the at least one component in order to secure the at least one component to the handheld tool; and
    multiple locks positioned along the handle, each lock configured to selectively prevent movement of the clip away from the projections along the handle past the lock;
    wherein one of the locks is configured, after the at least one component is secured, to prevent movement of the clip away from the projections and thereby prevent release of the at least one component from the tool;
    wherein the handheld tool comprises a raised outer edge around a periphery of the handheld tool;
    wherein the base comprises two projections that are symmetric on the base, the two projections extending upward from the raised outer edge; and
    wherein a gap in the raised outer edge is located between the two projections.

19. The handheld tool of claim 14, wherein the clip comprises a gap defining a space configured to accommodate a depressed one of the locks so that the clip is able to pass by the depressed lock while sliding along the handle.

20. The handheld tool of claim 14, wherein the first portions of the at least one component are different from the second portion of the at least one component.

* * * * *